US012740137B2

(12) United States Patent
Vulcano Rossi et al.

(10) Patent No.: US 12,740,137 B2
(45) Date of Patent: Sep. 15, 2026

(54) INTEGRATED CIRCUIT WITH FINFET WITH SHORTER AND NARROWER FIN UNDER GATE ONLY

(71) Applicant: GlobalFoundries U.S. Inc., Malta, NY (US)

(72) Inventors: Vitor A. Vulcano Rossi, Saratoga Springs, NY (US); Anton V. Tokranov, Halfmoon, NY (US); Hong Yu, Clifton Park, NY (US); David C. Pritchard, Schenectady, NY (US)

(73) Assignee: GlobalFoundries U.S. Inc., Malta, NY (US)

(*) Notice: Subject to any disclaimer, the term of this patent is extended or adjusted under 35 U.S.C. 154(b) by 450 days.

(21) Appl. No.: 18/358,157

(22) Filed: Jul. 25, 2023

(65) Prior Publication Data

US 2025/0040237 A1 Jan. 30, 2025

(51) Int. Cl.

| | |
|---|---|
| ***H10D 84/83*** | (2025.01) |
| ***H10D 62/17*** | (2025.01) |
| ***H10D 64/01*** | (2025.01) |
| ***H10D 84/01*** | (2026.01) |
| ***H10D 84/03*** | (2025.01) |

(52) U.S. Cl.

CPC ......... *H10D 84/834* (2025.01); *H10D 62/292* (2025.01); *H10D 64/017* (2025.01); *H10D 84/0128* (2025.01); *H10D 84/0151* (2025.01); *H10D 84/0158* (2025.01); *H10D 84/038* (2025.01)

(58) Field of Classification Search

CPC ............. H01D 84/834; H01D 84/0128; H01D 84/0151; H01D 84/0158; H01D 84/038; H01D 84/8311; H10D 30/0245; H10D 30/6213

See application file for complete search history.

(56) References Cited

U.S. PATENT DOCUMENTS

| | | | | |
|---|---|---|---|---|
| 9,530,654 | B2 | 12/2016 | Licausi | |
| 9,972,621 | B1 | 5/2018 | Wu et al. | |
| 10,068,902 | B1 | 9/2018 | Shen et al. | |
| 2008/0157225 | A1 | 7/2008 | Datta et al. | |
| 2013/0082333 | A1 | 4/2013 | Chen et al. | |
| 2016/0268400 | A1 | 9/2016 | Akarvardar et al. | |
| 2017/0092756 | A1* | 3/2017 | Lai | H10D 30/024 |
| 2018/0053824 | A1* | 2/2018 | Wang | H10D 30/6211 |
| 2018/0151739 | A1* | 5/2018 | Liang | H10D 30/6212 |
| 2021/0376085 | A1 | 12/2021 | Wang et al. | |
| 2024/0107736 | A1* | 3/2024 | Wu | H10B 10/125 |

* cited by examiner

*Primary Examiner* — Marc-Anthony Armand

(74) *Attorney, Agent, or Firm* — Francois Pagette; Hoffman Warnick LLC

(57) ABSTRACT

An integrated circuit includes a fin having a height and a width under a gate of a selected fin-type field effect transistor (FinFET) that is less than the height and width along a remainder of the fin including under gates and for source/drain regions of other FinFETs. The IC includes a first FinFET having a first gate over a fin having a first height and a first width under the first gate, and a second FinFET in the fin adjacent to the first FinFET. The second FinFET has a second gate over the fin, and the fin has, under the second gate only, a second height less than the first height and a second width less than the first width. The resulting reduced channel height and width for the second FinFET increases gate control and reduces gate leakage, which is beneficial for ultra-low current leakage (ULL) devices.

20 Claims, 10 Drawing Sheets

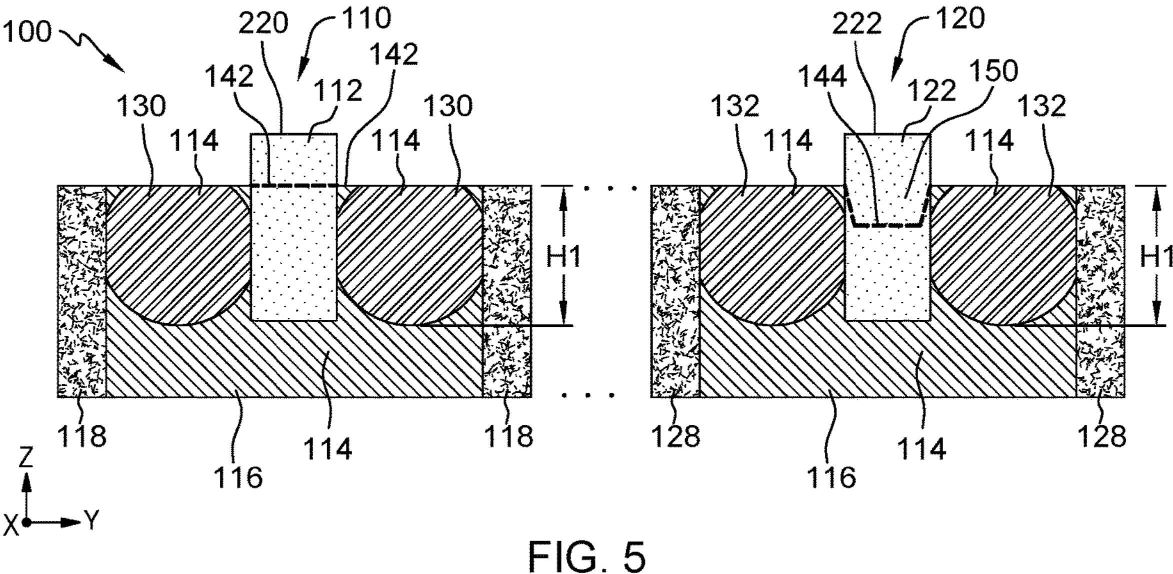
FIG. 5
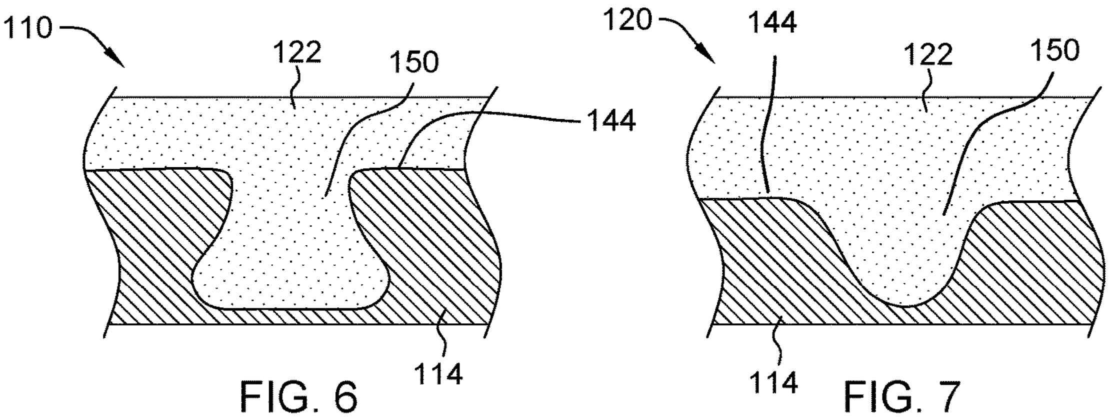
FIG. 6
FIG. 7

INTEGRATED CIRCUIT WITH FINFET WITH SHORTER AND NARROWER FIN UNDER GATE ONLY

BACKGROUND

The present disclosure relates to integrated circuits and, more particularly, to an integrated circuit including a fin-type field effect transistor (FinFET) having a shorter and narrower fin under the gate only, i.e., in a channel thereof.

Integrated circuits with ultra-low power and leakage (ULL) FinFETs are desirable to increase battery life for a wide variety of applications. The ULL FinFETs are typically used with regular high threshold voltage and higher current leakage FinFETs. Fabricating both types of devices is difficult to achieve without complicated processing steps and additional costs.

SUMMARY

All aspects, examples and features mentioned below can be combined in any technically possible way.

An aspect of the disclosure provides an integrated circuit (IC), comprising: a first fin-type field effect transistor (FinFET) having a first gate over a fin having a first height and a first width under the first gate; and a second FinFET in the fin adjacent to the first FinFET, the second FinFET having a second gate over the fin, the fin having, under the second gate only, a second height less than the first height and a second width less than the first width.

An aspect of the disclosure provides an integrated circuit (IC), comprising: a fin having a first height and a first width under a first gate of a first fin-type field effect transistor (FinFET) and a second height greater than the first height and a second width greater than the first width along a remainder of the fin including under a second gate of a second FinFET and a source/drain region of the first FinFET and the second FinFET.

An aspect of the disclosure provides a method, comprising: forming a first fin-type field effect transistor (FinFET) having a first gate over a fin having a first height and a first width under the first gate; and forming a second FinFET in the fin adjacent to the first FinFET, the second FinFET having a second gate over the fin, the fin having a second height less than the first height and a second width less than the first width under the second gate only.

Two or more aspects described in this disclosure, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein:

FIG. 5 shows a cross-sectional view of the IC in an X-direction longitudinally through a fin, according to embodiments of the disclosure;

FIG. 6 shows an enlarged cross-sectional view of an opening in an upper surface of a fin for the second FinFET, according to additional embodiments of the disclosure;

FIG. 7 shows an enlarged cross-sectional view of an opening in an upper surface of a fin for the second FinFET, according to other embodiments of the disclosure;

Figures 1, 2:
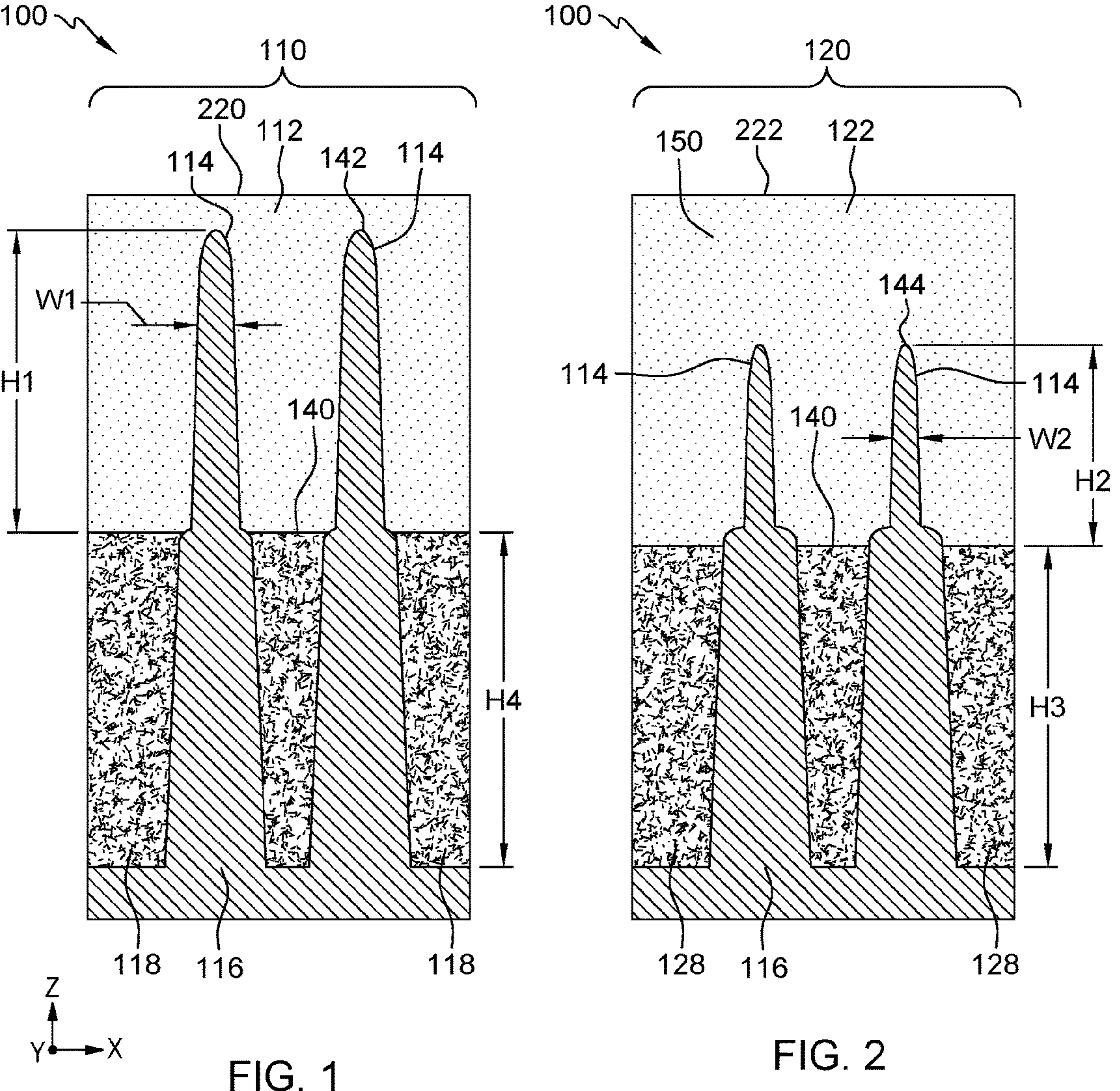
FIG. 1 shows a cross-sectional view of a first FinFET of an integrated circuit (IC) in a Y-direction across a pair of fins, according to embodiments of the disclosure.
FIG. 2 shows a cross-sectional view of a second FinFET of an IC in a Y-direction across a pair of fins having a shorter height and narrower width than that of the first FinFET, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include an integrated circuit (IC). The IC includes a fin having a height and a width under a gate of a selected fin-type field effect transistor (FinFET), i.e., the FinFET's channel, that is less than the height and width along a remainder of the fin including under gates and in source/drain regions of other FinFETs. More particularly, the IC includes a first FinFET having a first gate over a fin having a first height and a first width under the first gate, and a second FinFET in the fin adjacent to the first FinFET. The second FinFET has a second gate over the fin, and the fin has, under the second gate only, a second height less than the first height and a second width less than the first width. The reduced channel height and width for the second FinFET increases gate control and reduces gate leakage, which is beneficial for ultra-low current leakage (ULL) devices. Regular threshold voltage and higher current leakage devices, i.e., using the first FinFET(s), are formed adjacent to the ULL devices with no changes to their channel size. The disclosed structure and method work with current contact schemes for gates and the current contact schemes for source/drain regions of the FinFETs.

Figures 3, 4:
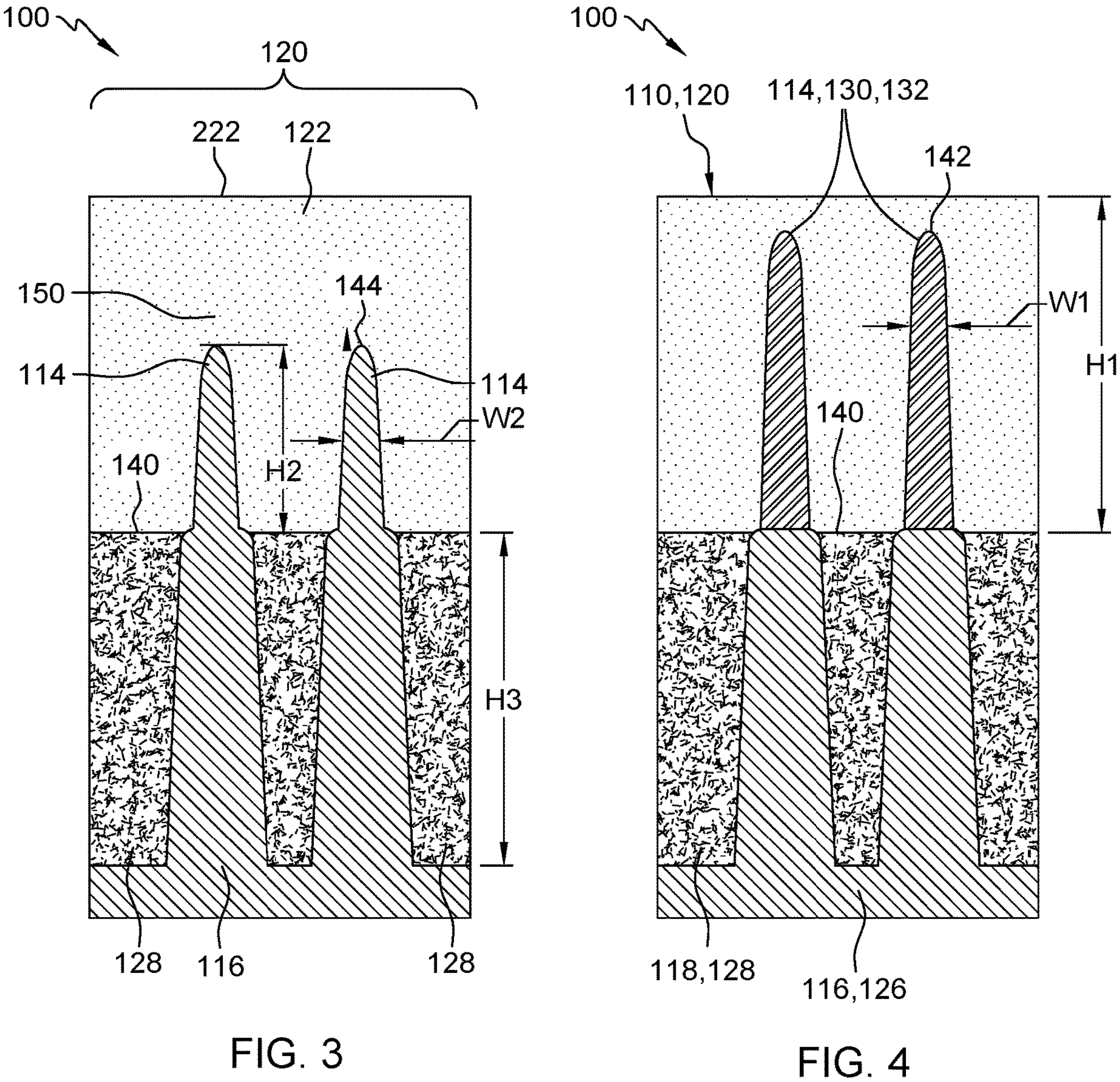
FIG. 3 shows a cross-sectional view of a second FinFET of an IC in a Y-direction across a pair of fins having a shorter height and narrower width than that of the first FinFET, according to other embodiments of the disclosure.
FIG. 4 show a cross-sectional view of the IC in a Y-direction across a pair of fins in a source/drain region, according to embodiments of the disclosure.

FIGS. 1-3 show cross-sectional views of an integrated circuit (IC) 100 in a Y-direction across a pair of fins in a gate region, FIG. 4 show a cross-sectional view of IC 100 in a Y-direction across a pair of fins in a source/drain region, and FIG. 5 shows a cross-sectional view of IC 100 in an X-direction longitudinally through a fin. Depending on the context of the drawing being referenced, the singular term "fin" and plural term "fins" will be used herein. It is emphasized that where more than one fin is described or shown, a single fin may be used, and, similarly, where a single fin is described or shown, more than one fin may be present but not shown.

IC 100 includes a first fin-type field effect transistor (FinFET) 110 having a first gate 112 over a fin 114 having a first height H1 and a first width W1 under first gate 112. IC 100 also includes a second FinFET 120 in a fin 114 adjacent to first FinFET 110. Second FinFET 120 has a second gate 122 over fin 114. In contrast to fin 114 under first gate 112, fin 114, under second gate 122 only, has a second height H2 less than first height H1 and a second width W2 less than first width W1. In other words, where IC 100 includes a shared fin 114, fin 114 has height H2 and width W2 under gate 122 of second FinFET 120 and height H1 greater than height H2 and a width W1 greater than width W2 along a remainder of the fin-including under gate 112 of first FinFET 110 and S/D regions 130, 132 (FIG. 4) of first FinFET 110 and second FinFET 120, respectively.

Note, first gate 112 and second gate 122 in FIGS. 1-5 are shown in a simplified manner as a single layer for clarity purposes. As will be recognized and will be described herein, as metal gates, they may include a number of different layers-see FIGS. 15A-B.

First FinFET 110 and second FinFET 120 have different sized channels, i.e., defined area under gates 112, 122. The smaller channel of second FinFETs 120 allow them to be used for ultra-low current leakage (ULL) devices with increased gate control and reduced gate leakage. First FinFETs 110 can be used for distinct threshold voltage (e.g., higher or lower) and higher current leakage devices adjacent to the ULL devices with no changes to their channel size. Second height H2 and second width W2 can be user specified to customize the channel size for second FinFET 120. For example, FIG. 3 shows another embodiment of second FinFET 120 having a different second height H2 and second width W2 compared to FIG. 2, but still less than first height H1 and less than first width W1, respectively. In certain embodiments, second height H2 can be user specified to be between 10% and 80% of first height H1. In any event, a difference between first height H1 and second height H2 is at least two nanometers. Fin "height," as used herein, is measured from an upper surface 140 of an adjacent trench isolation 118, 128 to an upper surface 142, 144 of the respective fin 114. Fin "width," as used herein, is measured across the fin from sidewall to sidewall at a location five nanometers (5 nm) from a top of fin 114.

Fin(s) 114 for each FinFET 110, 120 may be the same fin, i.e., FinFETs 110, 120 are adjacent one another into or out of the page (with diffusion breaks (not shown) separating them), or they may be adjacent fins, i.e., in a series of parallel fins. In any event, as understood in the art, fins 114 may extend from a substrate 116, and be made of the same base semiconductor material.

IC 100 also includes a first trench isolation 118 adjacent first FinFET 110 and a second trench isolation 128 adjacent second FinFET 120. For reasons to be described herein, second trench isolation 128 is shorter than first trench isolation 118, i.e., height H3<height H4, as measured from a lower extent of trench isolations 118, 128 in substrate 116 to an upper surface 140 of trench isolations 118, 128. Similarly, first trench isolation 118 is taller than second trench isolation 128.

Despite the different channel sizes, IC 100 does not require changing how contacts (not shown) land on gates 112, 122 or S/D regions 130, 132 because their upper surfaces remain the same size as typically used. More particularly, outside an area under second gate 122, fin 114 has first width W1 and first height H1, like that for first FinFET 110. As shown in FIGS. 4 and 5, first FinFET 110 has source/drain (S/D) regions 130 and second FinFET 120 has S/D regions 132, both in fin 114, and having a same width W1 and a same height H1. Despite the different upper surfaces of fin 114 for first FinFET 110 and second FinFET 120, as shown in FIGS. 1-3 and 5, first gate 112 and second gate 122 are coplanar. First gate 112 and second gate 122 also have the same width (into and out of page). Hence, contacts can land on the parts of the FinFETs in the same manner as if the narrower and shorter fin was not present.

As shown in FIG. 5 and as will be described further herein, fin 114 for second FinFET 120 being shortened and narrowed, results in an opening 150 in upper surface 144 of the respective fin(s) 114 extending in a longitudinal direction of the respective fin(s) 114. Upper surface 142 of fin 114 for first FinFET 110 does not include opening 144 and is generally planar. Second gate 122 fills opening 150. The shape of opening 150 may vary. As shown in FIG. 5, second gate 122 fills a trapezoidal shaped opening 150 defined in upper surface 144 of fin(s) 114 for second FinFET 120. That is, opening 150 has a trapezoidal shape. In the FIG. 5 example, an upper end of opening 150 is wider than a lower end thereof. In an alternative embodiment, shown in FIG. 6, trapezoidal shaped opening 150 may undercut upper surface 144 of fin(s) 114, such that a lower end of opening 150 is wider than an upper end thereof. In another embodiment, shown in FIG. 7, opening 150 has a U-shape such that second gate 122 fills U-shaped opening 150 defined in upper surface 144 of fin(s) 114. The recessing process, described herein, can be controlled to generate the afore-described shapes for opening 150.

Figures 8, 9:
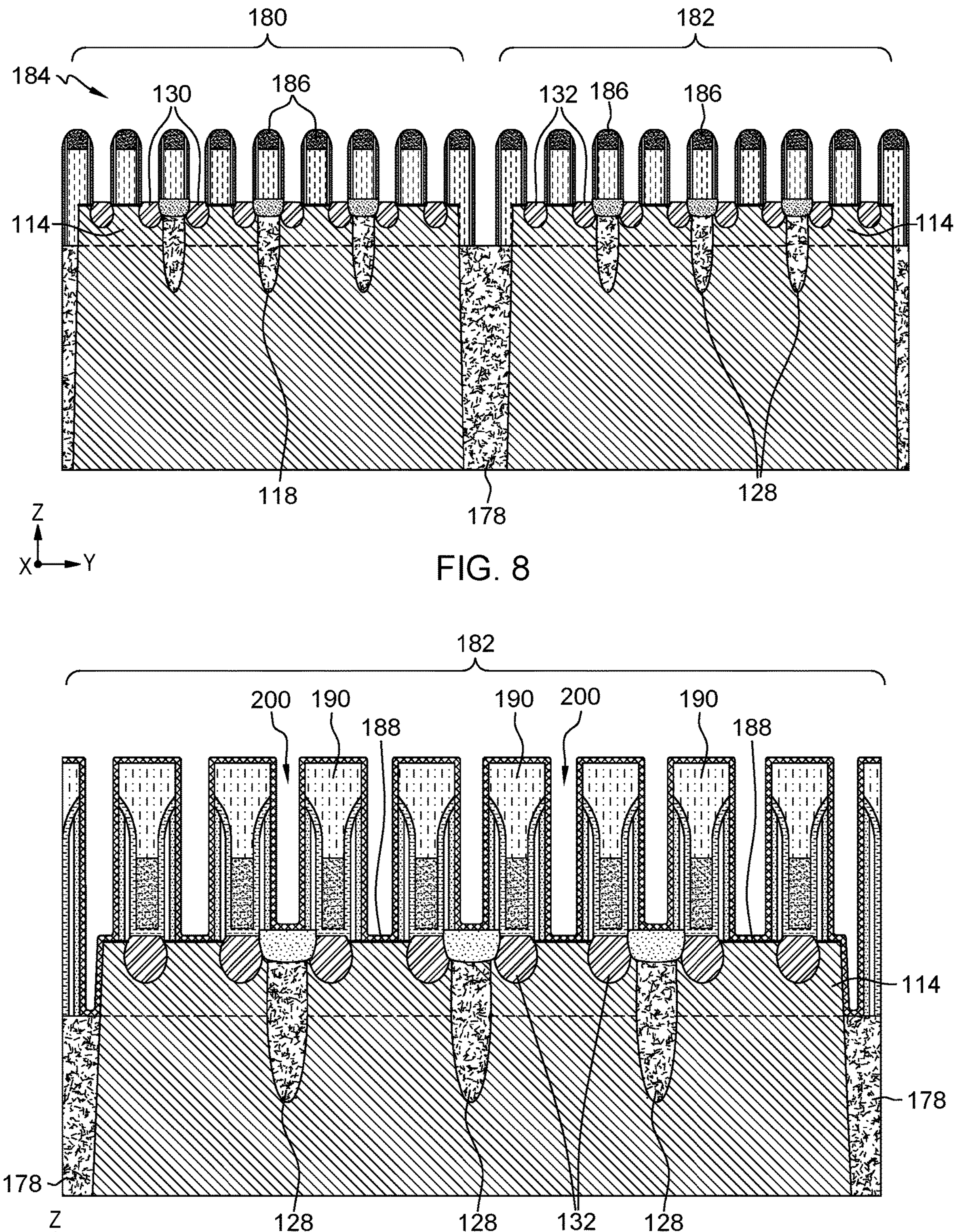
FIG. 8 shows a cross-sectional view in an X-direction of a preliminary structure for a method, according to embodiments of the disclosure.
FIG. 9 shows a cross-sectional view of the preliminary structure after a dummy gate pull in a replacement metal gate (RMG) process, according to embodiments of the disclosure.

FIGS. 8-15B show cross-sectional views of a method of forming IC 100, according to embodiments of the disclosure. FIGS. 8 and 9 and those drawings labeled 'A' (i.e., FIGS. 10A, 11A, 12A, 13A, 14A and 15A) show cross-sectional views of processing in an X-direction longitudinally through the structure (e.g., through a pair of fins) and showing gate regions 180, 182 for first and second FinFETs 110, 120, respectively. In contrast, those drawing labeled 'B' (i.e., FIGS. 10B, 11B, 12B, 13B, 14B and 15B) show cross-sectional views of processing in a Y-direction across a plurality of fins 114 in gate region 182 for only second FinFETs 120. While a plurality of fins 114 are shown, only one can be used. View lines B-B are shown in each 'A' labeled drawing. A deep trench isolation (DTI) 178 may electrically isolate regions 180, 182 and the different FinFETs 110, 120.

Generally, the method includes forming first FinFET 110 having first gate 112 over fin(s) 114 having first height H1 and first width W1 under first gate 112 and forming second FinFET 120 in fin(s) 114 adjacent to first FinFET 110. As noted, second FinFET 120 has second gate 122 over fin(s) 114 having a second height H2 less than first height H1 and second width W2 less than first width W1 under second gate 122 only. While the method may take a variety of forms, in certain embodiments, the method may be implemented as part of a replacement metal gate (RMG) process. The RMG process may include any now known or later developed RMG techniques.

FIG. 8 shows a cross-sectional view of a preliminary structure 184 for an RMG process. Structure 184 includes a plurality of patterned dummy gates 186 in each region 180, 182 over fin(s) 114. Fin(s) 114 may be formed over substrate 116 in any now known or later developed fashion, such as but not limited to patterning a mask and etching fin(s) 114 into a surface of substrate 116. Fin(s) 114 and substrate 116 may include any semiconductor material, as described elsewhere herein. Trench isolations 118, 128, 178 are shown already formed in FIG. 8. Trench isolations 118, 128, 178 may be formed, e.g., by forming a trench using a patterned mask and etching, then filling the trench with a dielectric. Trench isolation 178 may be deeper than trench isolation 118, 128 into substrate 116.

Dummy gates 186 may be formed using any now known or later developed processing, e.g., depositing a sacrificial material layer for the dummy gates, patterning a mask and etching, and then removing the mask. Dummy gates 186 may include any desired sacrificial material, such as amorphous silicon or polysilicon.

At this stage, S/D regions 130, 132 have been formed in regions 180, 182. S/D regions 130, 132 may be formed using any appropriate doping process, e.g., ion implanting using dummy gates 186 to direct the implant and an annealing to drive in the dopants. S/D regions 130, 132 may include any type of dopant appropriate for the type of FinFET to be formed thereby. For example, the dopants may include phosphorous (P), arsenic (As), antimony (Sb) for an n-type FinFET, or boron (B), indium (In) and gallium (Ga) for a p-type FinFET. As understood in the field, epitaxial growth with some form of doping may be used to form raised S/D regions 130, 132 (not shown). As known in the art, once S/D regions 130, 132 are formed, a plurality of layers may be formed between dummy gates 186, as shown in FIG. 8, including, for example, sidewall spacer layers (if not already present on dummy gates 186), etch stop layers (e.g., silicon nitride) and interlayer dielectric (ILD) layer(s) (not in FIG. 8). ILD layer(s) may include any now known or later developed ILD material, such as but not limited to spin coated oxide (e.g., tonen silazene (TOSZ) oxide) and/or a high-density plasma (HDP) oxide. The additional layers fill a space between dummy gates 186. As details of these processes are well known in the art further details are omitted to focus on the salient aspects of the disclosure.

FIG. 9 shows the RMG process after a step commonly called "dummy gate pull." In this process, dummy gates 186 (FIG. 8) may be removed using any now known or later developed process. In one example, dummy gates 186 (FIG. 8) are etched away, for example, by a reactive ion etch (RIE). FIG. 9 also shows depositing a dielectric layer 188 over fin 114 and remaining pillars 190, the latter formed from the afore-described plurality of layers. Dielectric layer 188 may include, but does not necessarily need to be, a gate dielectric material, such as but not limited to hafnium silicate (HfSiO), hafnium oxide ($HfO_2$), zirconium silicate ($ZrSiO_x$), zirconium oxide ($ZrO_2$), silicon oxide ($SiO_2$), silicon nitride ($Si_3N_4$), silicon oxynitride (SiON), high-k material or any combination of these materials. In certain embodiments, dielectric layer 188 includes silicon oxide ($SiO_2$), which may be deposited using, for example, atomic layer deposition (ALD).

Forming second height H2 and second width W2 of fin 114 includes recessing fin(s) 114 in a fin gate region 200 for second gate 122 for second FinFET 120 (FIGS. 2-3) after the dummy gate pull in the RMG process. FIGS. 10-14B show embodiments of a process to perform the recessing.

Figures 10A, 10B:
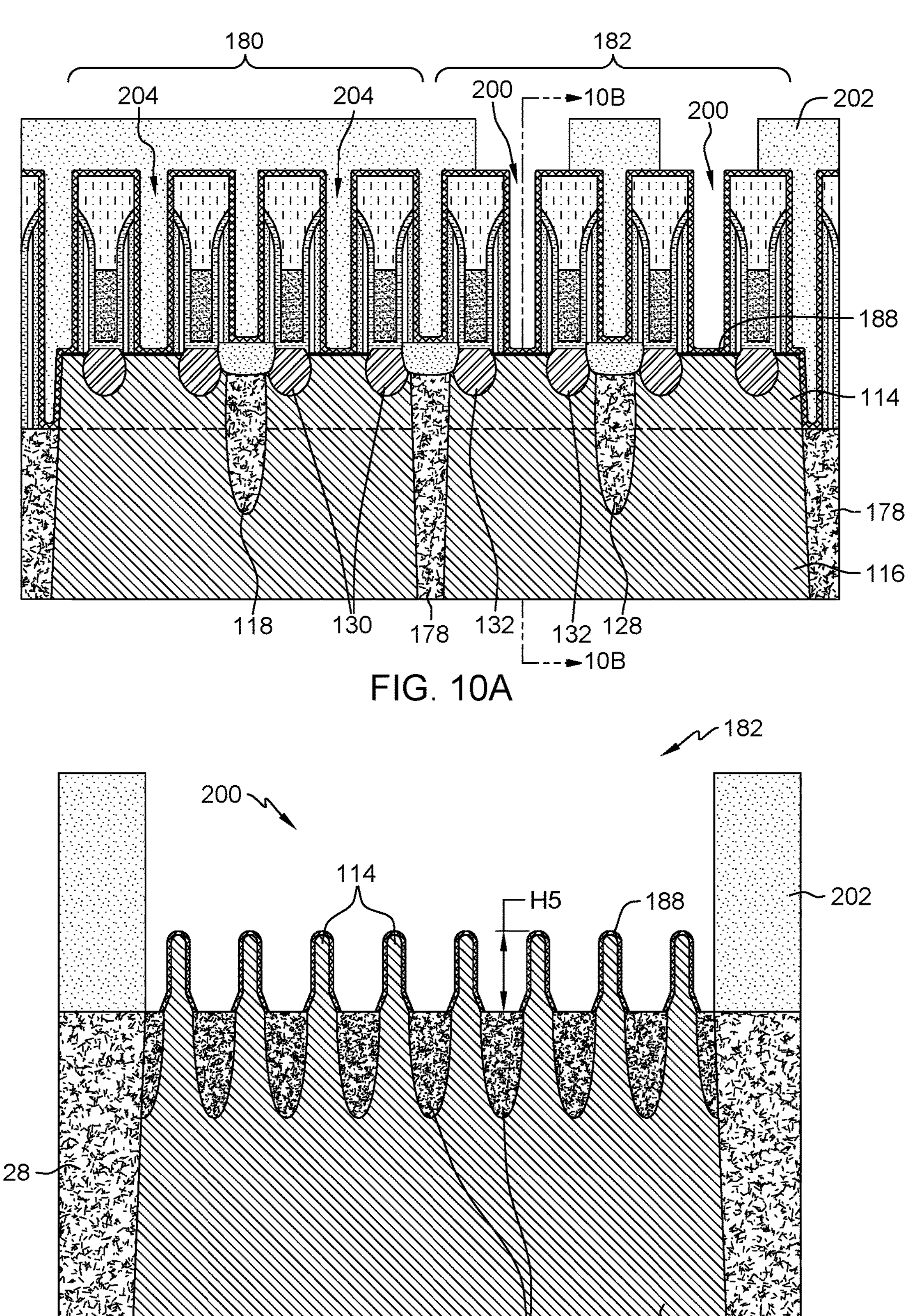
FIGS. 10A-B show cross-sectional views in an X-direction and a Y-direction, respectively, showing forming a dielectric layer, according to embodiments of the disclosure.

FIGS. 10A-B show forming a mask 202 exposing fin(s) 114 in fin gate region 200 for second gate(s) 122 (FIGS. 2-3) of second FinFET(s) 120 (FIGS. 2-3), i.e., in region 182. Mask 202 covers fin(s) 114 in a fin gate region 204 for first gate(s) 112 (FIG. 1) for first FinFET(s) 110 (FIG. 1), which is exposed by the dummy gate pull (FIG. 9). Mask 202 may include any now known or later developed masking material, such as but not limited to a photoresist. FIG. 10B shows dielectric layer 188 over sidewalls of fins 114.

Figure 11A:
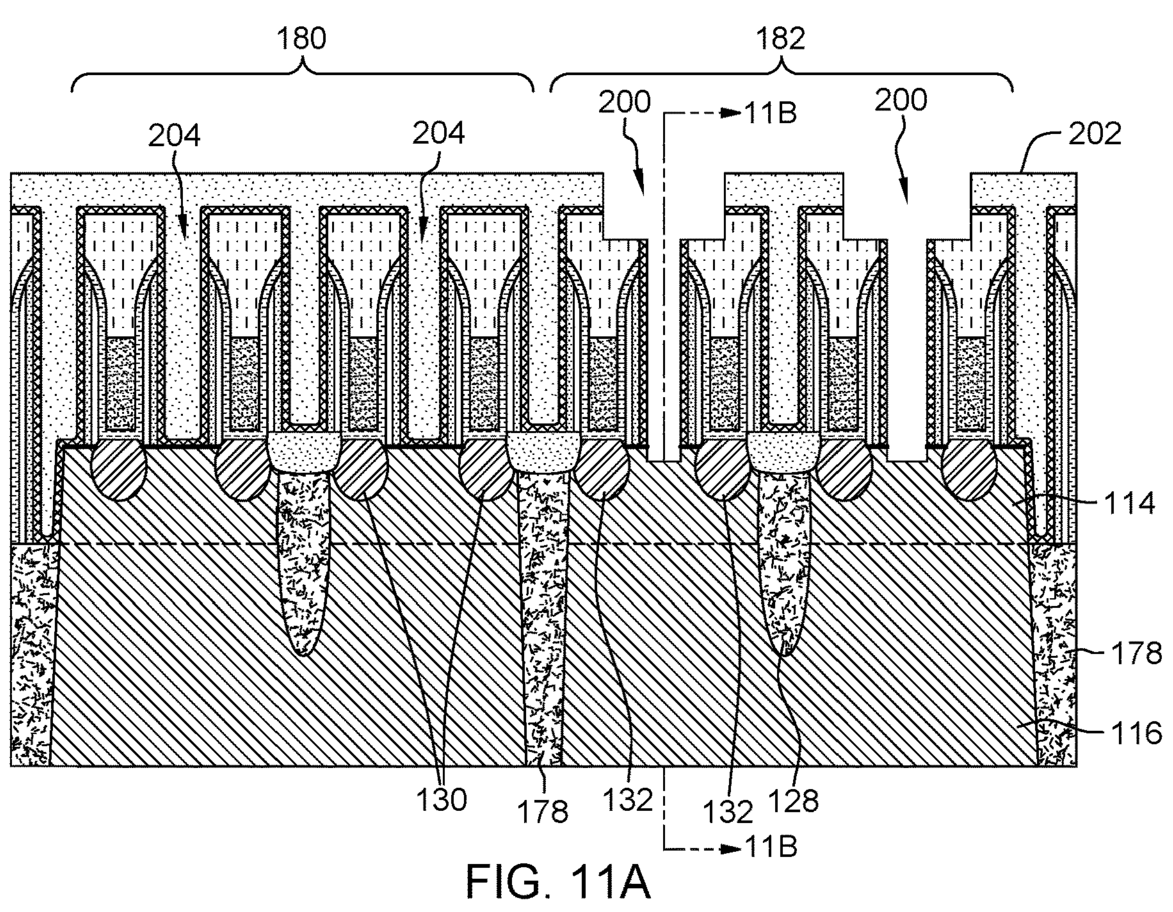
FIGS. 11A-B show cross-sectional views in an X-direction and a Y-direction, respectively, showing a first process of recessing the fin(s), according to embodiments of the disclosure.
Figure 11B:
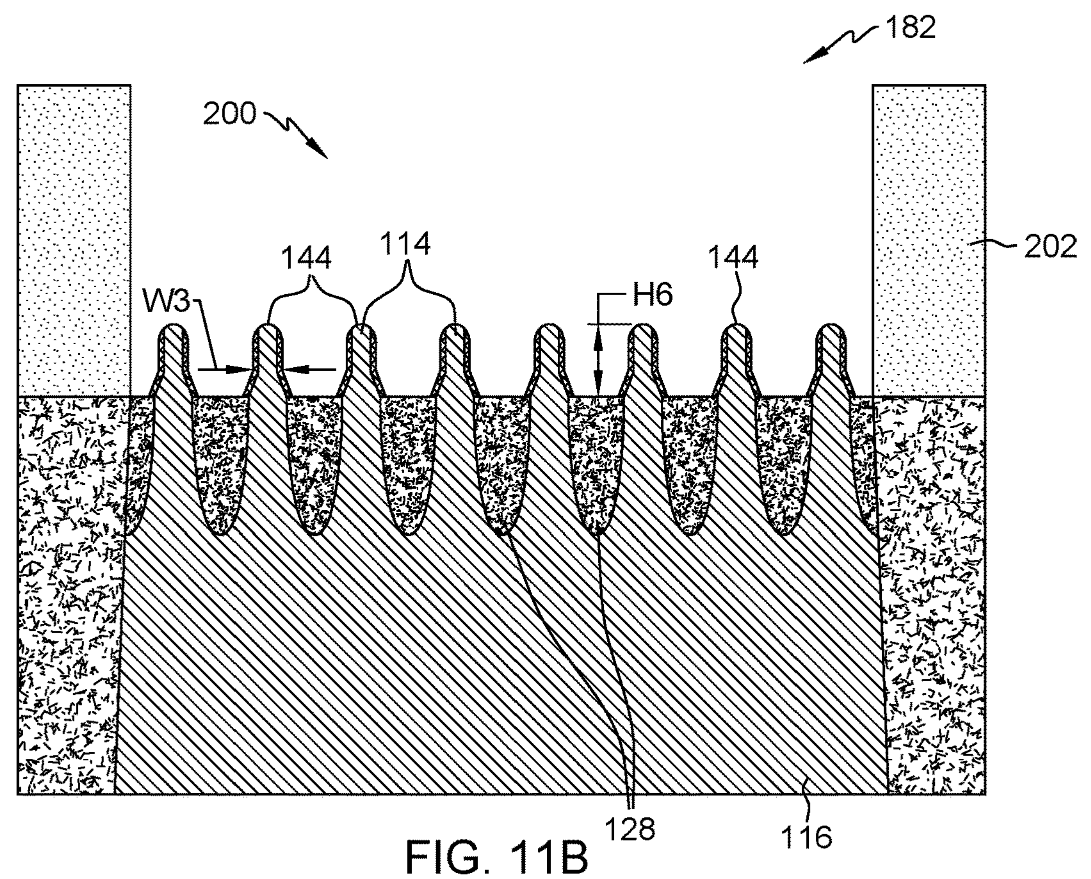

FIGS. 11A-B show performing a directional etch in fin gate region 200 for second gate(s) 122 (FIGS. 2-3) of second FinFET(s) 120 (FIGS. 2-3) to remove dielectric layer 188 (FIGS. 10A-B) over fin(s) 114 and reduce at least a height of fin(s) 114. The etching process may include any now known or later developed directional etching process, such as but not limited to a RIE. As shown in FIG. 11B, the etching process removes dielectric layer 188 over upper surface 144 of fin(s) 114 and shortens fin(s) 114 vertically. Dielectric layer 188 mostly remains on sidewalls of fin(s) 114. This process may remove 5% to 80% of an original height H5 of fin 114 (FIG. 10B), resulting in interim height H6 (FIG. 11B). In a non-limiting example, in a 14 nanometer technology node, this etching process may result in 10-20 nanometers in height being removed.

Figure 12A:
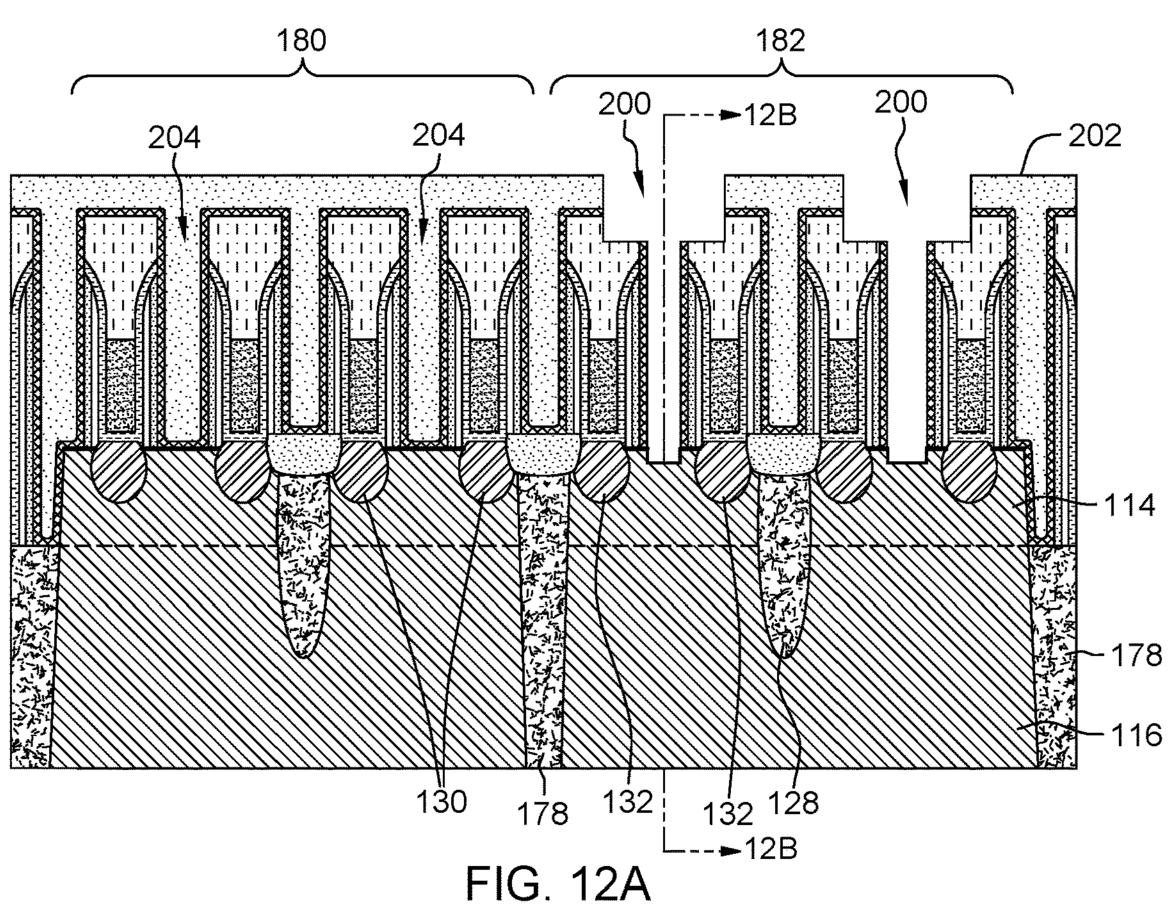
FIGS. 12A-B show cross-sectional views in an X-direction and a Y-direction, respectively, showing a second process of recessing the fin(s), according to embodiments of the disclosure.
Figure 12B:
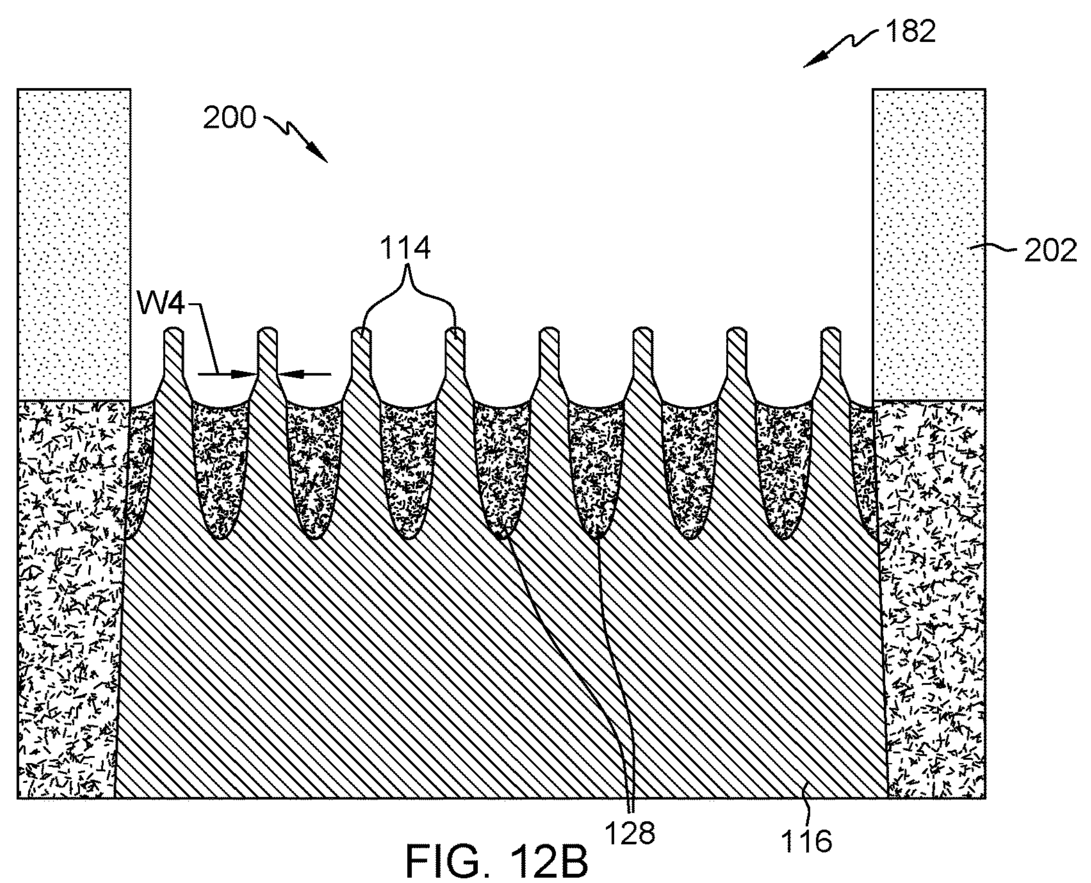

FIGS. 12A-B shows performing a first isotropic etch in fin gate region 200 for second gate(s) 122 (FIGS. 2-3) of second FinFET(s) 120 (FIGS. 2-3) to remove dielectric layer 188 from sidewalls of fin(s) 114 and reduce at least a width of fin(s) 114. The isotropic etch may include any multi-directional etching process that removes dielectric layer 188. Where dielectric layer 188 includes silicon oxide, the isotropic etch may include, for example, a vaporized or diluted hydrofluoric acid wet etch. This process may remove in one non-limiting example, 1-10% of an original width W3 of fin 114 (FIG. 11B) (mainly, a cumulative thickness of dielectric layer 188), resulting in interim width W4 (FIG. 12B). Some of the height of fin 114 may also be removed during the first isotropic etch. Further, some of isolation region 128 may be removed adjacent fins 114 during the first isotropic etch.

Figure 13A:
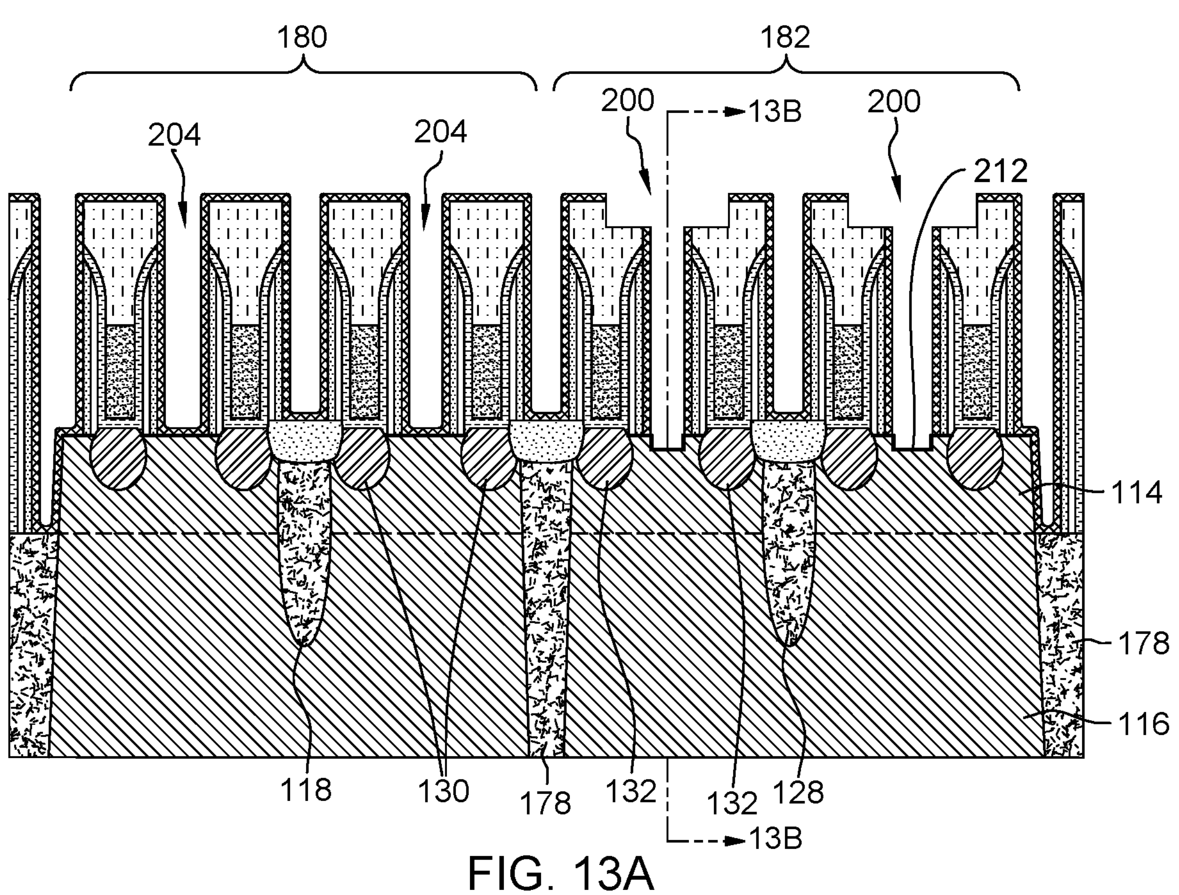
FIGS. 13A-B show cross-sectional views in an X-direction and a Y-direction, respectively, showing forming an oxide layer on the fin(s), according to embodiments of the disclosure.
Figure 13B:
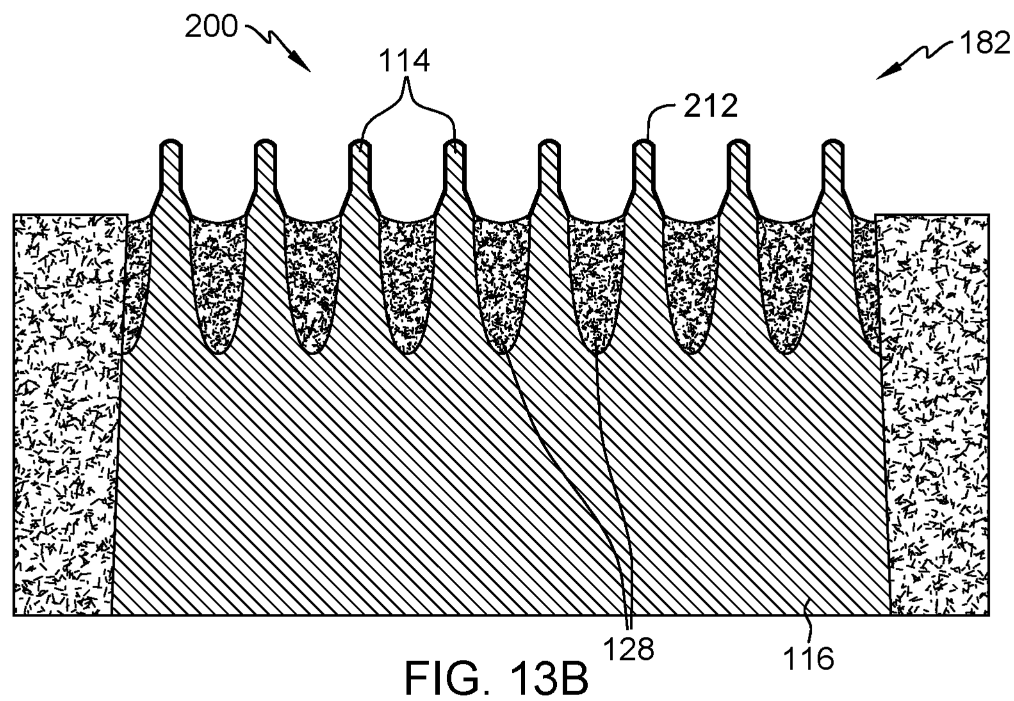

FIGS. 13A-B show forming an oxide layer 212 on fin 114 in fin gate region 200 for second gate(s) 122 (FIGS. 2-3) of second FinFET(s) 120 (FIGS. 2-3). Oxide layer 212 may be formed in a number of ways. In some embodiments, oxide layer 212 may be formed by performing a plasma oxidation or a thermal treatment. In addition, or alternatively thereto, oxide layer 212 may be formed by an oxygen-based ashing process used to remove mask 202 (FIGS. 12A-B). In any event, as shown in FIG. 13B, oxide layer 212 oxidizes part of fin 114 and covers all of exposed fin(s) 114.

Figure 14A:
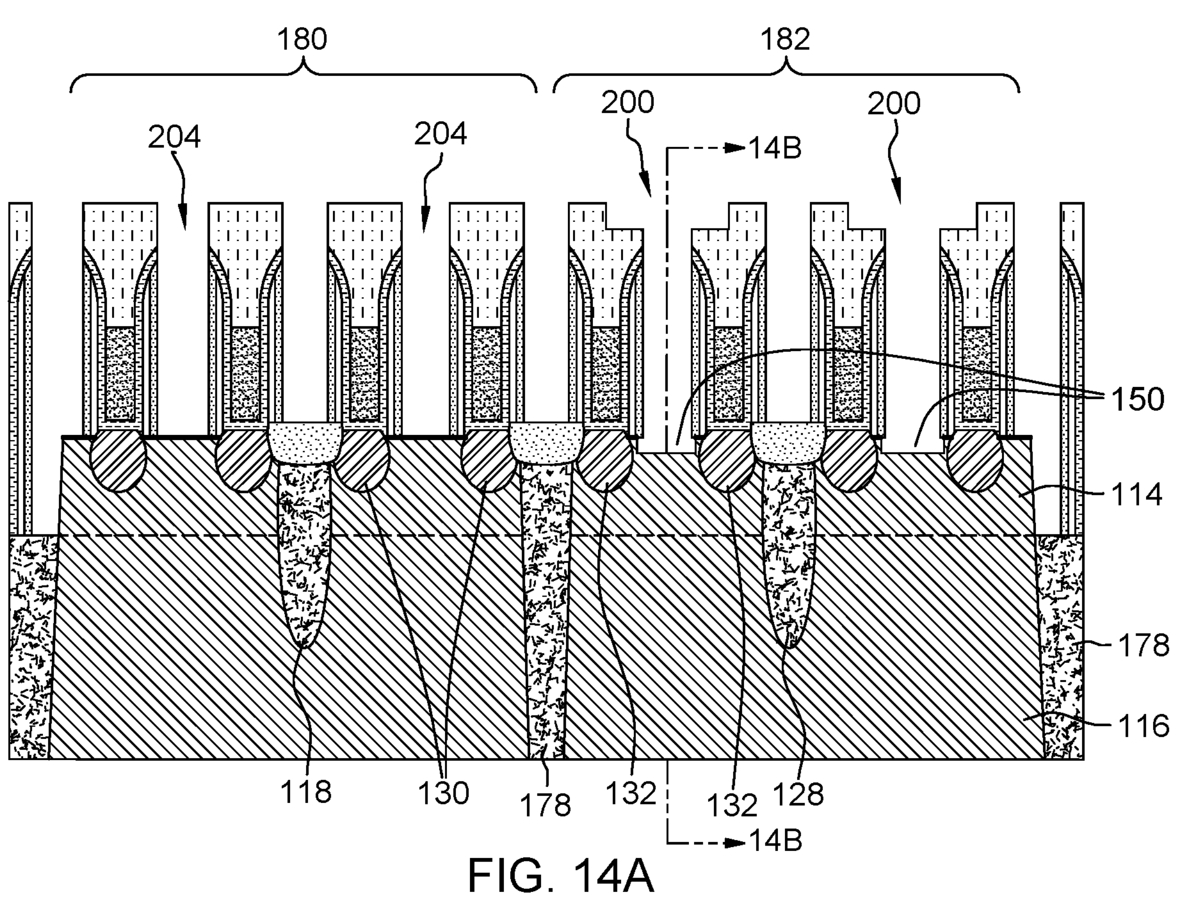
FIGS. 14A-B show cross-sectional views in an X-direction and a Y-direction, respectively, showing a third process of recessing the fin(s), according to embodiments of the disclosure.
Figure 14B:
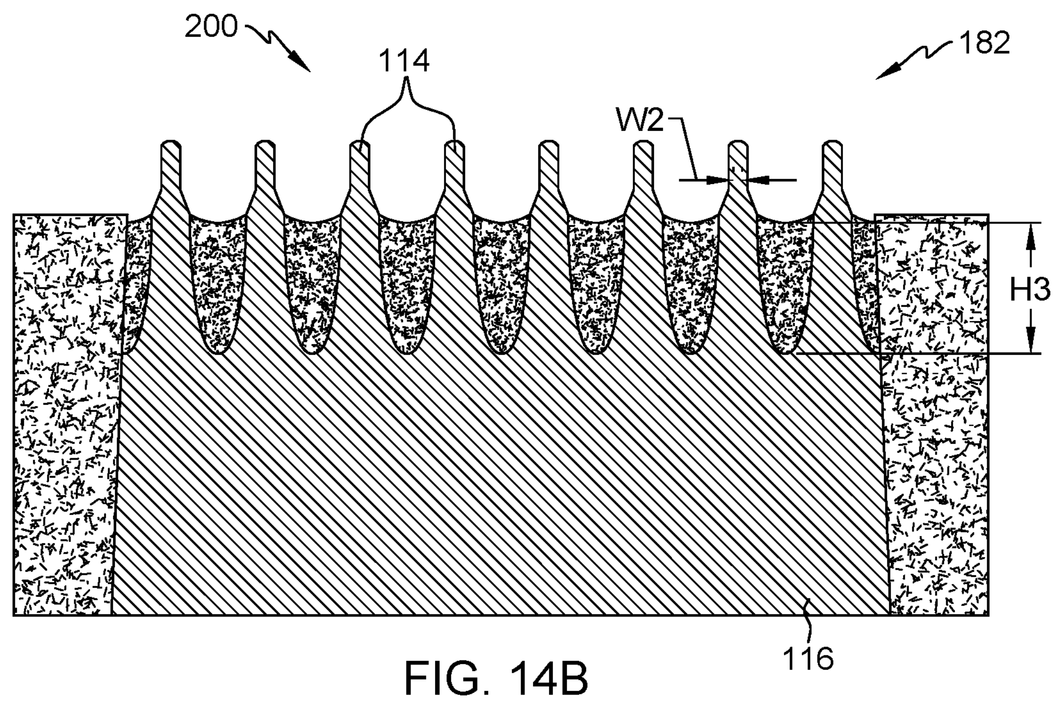

FIGS. 14A-B show performing a second isotropic etch in fin gate region 200 for second gate(s) 122 (FIGS. 2-3) of second FinFET(s) 120 (FIGS. 2-3) to remove oxide layer 212 and reduce at least the width of fin 114. The second isotropic etch may be similar to the first isotropic etch and may include any multi-directional etching process that removes oxide layer 212, for example, a vaporized or diluted hydrofluoric acid wet etch. This process may remove, for example, 15-50% of interim width W4 of fin 114 (FIG. 12B), resulting in final width W2 (FIG. 14B) of fin(s) 114. Some of the height of fin(s) 114 may also be removed during the second isotropic etch. Opening 150 (FIGS. 5-7), as described herein, is formed in upper surface 144 of fin(s) 114. With mask 202 (FIGS. 13A-B) removed, the second isotropic etch may also be performed in selected fin gate region 204 for first gate(s) 112 (FIG. 1) of first FinFET(s) 110 (FIG. 1). This process may be performed contemporaneously with a process to remove or thin oxide layer 212 in certain types of first FinFETs 110, e.g., remove long-channel device oxide layer 212 from any short-channel device areas. A mask (not shown) may be used to cover other first FinFET(s) 110 for which gate oxide layer 212 removal or thinning is undesired, e.g., short-channel devices. Hence, oxide layer 212 may be removed for second FinFETs 120 (FIGS. 2-3) and short-channel types of first FinFETs 110.

As noted previously, the method includes forming second trench isolation 128 adjacent second FinFET(s) 120 (FIGS. 2-3) and first trench isolation 118 adjacent first FinFET(s) 110 (FIG. 1). With further regard to FIG. 14B, during the etching processes performed on fin(s) 114 (FIGS. 11A-14B), trench isolation(s) 128 adjacent second FinFET(s) 120 (FIGS. 2-3) may be exposed to at least some of the etching chemistry(ies), which removes some of the height of trench isolation(s) 128. In contrast, first trench isolation(s) 118 are protected by mask 202. Consequently, second trench isolation(s) 128 adjacent second FinFET(s) 120 (FIG. 2) are shorter than first trench isolation(s) 118 adjacent first FinFET(s) 110 (FIG. 1). More particularly, as shown in FIGS. 1-2, second trench isolation 128 is shorter than first trench isolation 118, i.e., height H3<height H4, as measured from a lower extent of trench isolations 118, 128 in substrate 116 to upper surface 140 of trench isolations 118, 128.

Figure 15A:
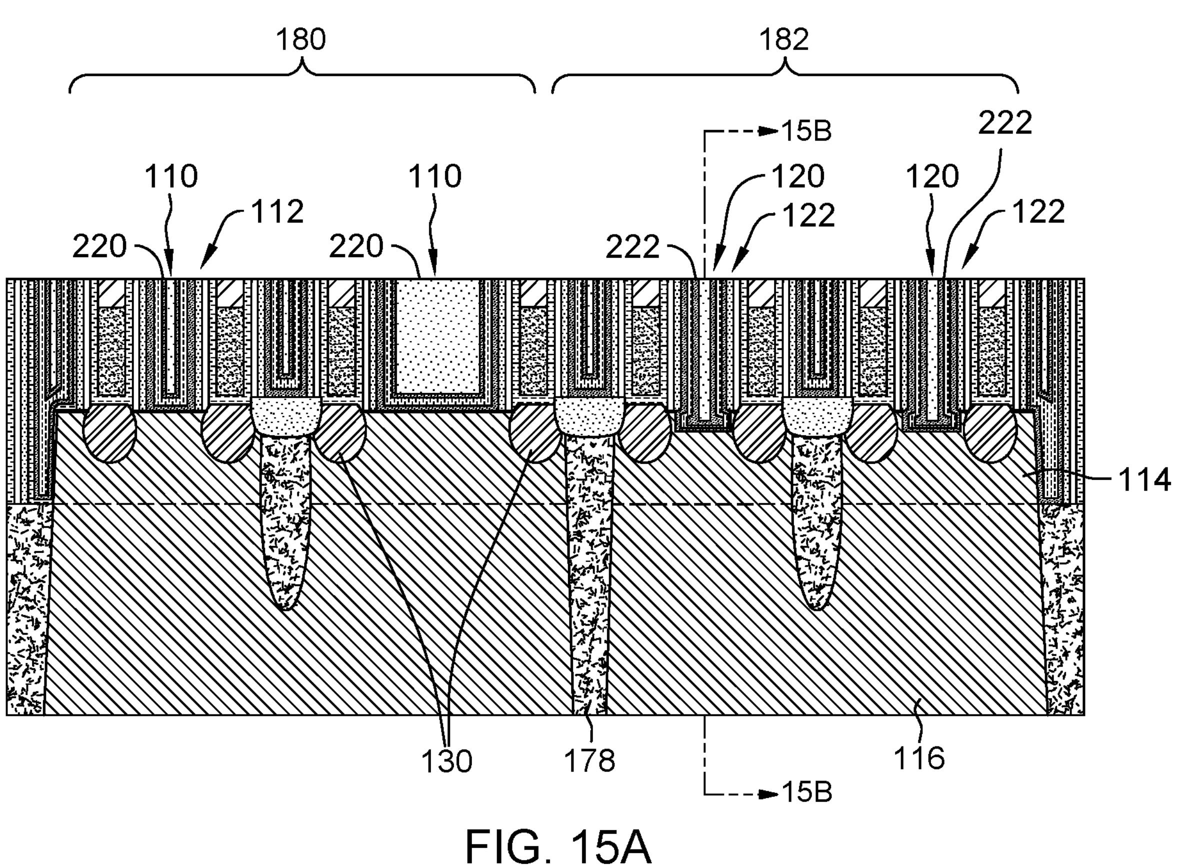
FIGS. 15A-B show cross-sectional views in an X-direction and a Y-direction, respectively, showing forming metal gates, according to embodiments of the disclosure.
Figure 15B:
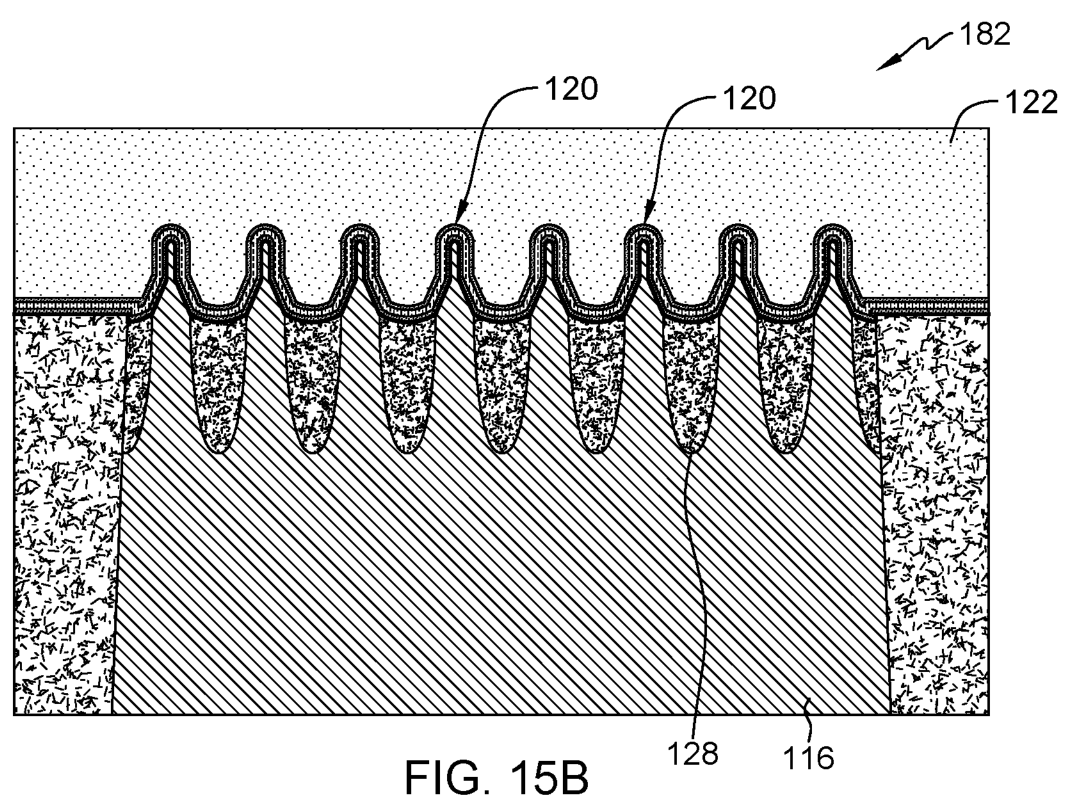

FIGS. 15A-B show removing mask 202, if not already removed in FIGS. 13A-B, and forming first gate(s) 112 in fin gate region 204 (FIG. 13A) for first gate(s) 112 of first FinFET(s) 110 and forming second gate(s) 122 in fin gate region 200 (FIG. 13A) for second gate(s) 122 of second FinFET(s) 120. As shown, first gate 112 and second gate 122 have coplanar upper surfaces 220, 222.

First and second gates 112, 122 may include any now known or later developed metal gates. It is noted that in the structures and methods described above, a metal gate can include, for example: a high-K gate dielectric layer; a work function metal layer on the high-K gate dielectric layer; an optional doped polysilicon gate conductor layer on the work function metal layer; and an optional metal silicide layer on the doped polysilicon gate conductor layer. Various different metal gate structures are known in the art and, thus, the details thereof have been omitted from this specification in order to allow the reader to focus on the salient aspects of the disclosed embodiments. However, those skilled in the art will recognize that the configuration of the gate stack for a metal gate can vary depending upon whether the FinFET is an n-type FinFET or a p-type FinFET. For example, the optimal effective work function for the gate structure of an n-FinFET is between about 3.9 eV and about 4.2 eV, whereas the optimal effective work function for the gate structure of a p-type FinFET is between about 4.9 eV and about 5.2 eV. The desired effective work function can be achieved, for example, by doping the polysilicon gate conductor layer with different dopants. For example, in an n-type FinFET, the polysilicon gate conductor layer can be doped with an n-type dopant (e.g., phosphorous (P), arsenic (As) or antimony (Sb)). In a p-type FinFET, the polysilicon gate conductor layer can be doped with p-type dopant (e.g., boron (B)). The desired effective work function can be achieved, for example, using different metal layers on the high-K gate dielectric layer. For example, in an n-type FinFET, the metal layers on the high-K gate dielectric layer can include a titanium nitride (TiN) capping layer and, on the TiN capping layer, a lanthanum (La) layer for optimal NFET-specific dipole formation. In a p-type FinFET, the metal layers on the high-K gate dielectric layer can include a TiN capping layer and, on the TiN capping layer, an aluminum (Al) layer for optimal p-type FinFET-specific dipole formation. In a metal gate, the desired effective work function can be achieved, for example, using different work function metal layers immediately adjacent to the high-K gate dielectric layer. Illustrative metals (and metal alloys), which have a work function within the range optimal for n-type FinFET performance (i.e., between 3.9 eV and about 4.2 eV) include, but are not limited to, hafnium, zirconium, titanium, tantalum, aluminum, and alloys thereof, such as, hafnium carbide, zirconium carbide, titanium carbide, tantalum carbide, and aluminum carbide. Illustrative metals (and metal alloys), which have a work function within the range optimal for p-type FinFET performance (i.e., between about 4.9 eV and about 5.2 eV) include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.).

Subsequent processing may include but is not limited to: planarizing any excess metal and forming any middle-of-line (MOL) or back-end-of-line (BEOL) interconnect layers to FinFETs 110, 120. Various different contact structures are known in the art and, thus, the details thereof have been omitted from this specification in order to allow the reader to focus on the salient aspects of the disclosed embodiments. However, those skilled in the art will recognize that upper surface 220, 222 configurations of first and second FinFETs 110, 120 have not diverged from conventional shapes and sizes. Consequently, while second FinFETs 120 have a smaller channel under second gate 122, any now known or later developed contact scheme for first and second gates 112, 122 and source/drain regions 130, 132 can be used.

Embodiments of the disclosure provide various technical and commercial advantages, examples of which are discussed herein. The reduced channel height and width for the second FinFETs increases gate control and reduces gate leakage, which is beneficial for ultra-low current leakage (ULL) devices. The different threshold voltage and higher current leakage devices, i.e., using first FinFETs, are formed adjacent to the ULL devices with no changes to their channel size. The disclosed structure and method work with current contact scheme for gates and the current contact scheme for the source/drain regions.

In the structures and method described above, a semiconductor material refers to a material whose conducting properties can be altered by doping with an impurity. Semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

The structure and method as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC), comprising:

a first fin-type field effect transistor (FinFET) having a first gate over a first fin having a first height and a first width under the first gate; and a second FinFET in a second fin adjacent to the first FinFET, the second FinFET having a second gate over the second fin, the second fin having a first portion under the second gate, the first portion having a second height less than the first height and a second width less than the first width, and a second portion adjacent and continuous with the first portion having a different height and a different width than the second portion.

2. The IC of claim 1, wherein the first FinFET and the second FinFET have source/drain regions in the first fin and second fin, respectively, having a same width and a same height.

3. The IC of claim 1, wherein the second height is between 10% and 80% of the first height.

4. The IC of claim 1, wherein a difference between the first height and the second height is at least two nanometers.

5. The IC of claim 1, wherein upper surfaces of the first gate and the second gate are coplanar.

6. The IC of claim 1, further comprising a first trench isolation adjacent the first FinFET and a second trench isolation adjacent the second FinFET, wherein the second trench isolation is shorter than the first trench isolation.

7. The IC of claim 1, wherein the second gate fills a trapezoidal shaped opening defined in an upper surface of the second fin.

8. The IC of claim 7, wherein the trapezoidal shaped opening undercuts the upper surface of the second fin.

9. The IC of claim 1, wherein the second gate fills a U-shaped opening defined in an upper surface of the second fin.

10. The IC of claim 1, wherein outside an area under the second gate, the second fin has the first width and the first height.

11. An integrated circuit (IC), comprising:

a first portion of a fin under a first gate of a first fin-type field effect transistor FinFET), the first portion having a first height and a first width, and a second portion of the fin along a remainder of the fin including under a second gate of a second FinFET and a source/drain region of the first FinFET and the second FinFET, the second portion having a second height greater than the first height and a second width greater than the first width.

12. The IC of claim 11, wherein a difference between the first height and the second height is at least two nanometers.

13. The IC of claim 11, wherein upper surfaces of the first gate and the second gate are coplanar.

14. The IC of claim 11, further comprising a first trench isolation adjacent the first FinFET and a second trench isolation adjacent the second FinFET, wherein the second trench isolation is taller than the first trench isolation.

15. The IC of claim 11, wherein the first gate fills an opening defined in an upper surface of the fin having one of: a trapezoidal shape and a U-shape.

16. A method, comprising:

forming a first fin-type field effect transistor (FinFET) having a first gate over a first fin having a first height and a first width under the first gate; and forming a second FinFET in a second fin adjacent to the first FinFET, the second FinFET having a second gate over the second fin, the second fin having a first portion under the second gate, the first portion having a second height less than the first height and a second width less than the first width, and a second portion adjacent and continuous with the first portion having a different height and width than the second portion under the second gate only.

17. The method of claim 16, wherein forming the second height and the second width of the second fin includes recessing the second fin in a fin gate region for the second gate for the second FinFET after a dummy gate pull in a replacement metal gate process.

18. The method of claim 17, wherein recessing the second fin after the dummy gate pull in the replacement metal gate process includes:

forming a mask exposing the fin gate region for the second gate of the second FinFET and covering the second fin for a fin gate region for the first gate for the first FinFET exposed by the dummy gate pull;

performing a directional etch in the fin gate region for the second gate of the second FinFET to remove a dielectric layer over the second fin and reduce at least a height of the second fin;

performing a first isotropic etch in the fin gate region for the second gate of the second FinFET to remove the dielectric layer from a sidewall of the second fin and reduce at least a width of the second fin;

forming an oxide layer on the second fin in the fin gate region for the second gate of the second FinFET; and performing a second isotropic etch in the fin gate region for the second gate of the second FinFET to remove the oxide layer and reduce at least the width of the second fin.

19. The method of claim 18, further comprising removing the mask and forming the first gate in the fin gate region for the first gate of the first FinFET and forming the second gate in the fin gate region for the second gate of the second FinFET, wherein the first gate and the second gate have coplanar upper surfaces.

20. The method of claim 18, further comprising forming a trench isolation adjacent the second FinFET and a trench isolation adjacent the first FinFET, wherein the trench isolation adjacent the second FinFET is shorter than the trench isolation adjacent the first FinFET.

* * * * *